United States Patent [19]

Lewallen

[11] Patent Number: 5,629,703
[45] Date of Patent: May 13, 1997

[54] METHOD FOR REDUCING HARMONIC DISTORTION IN AN ANALOG-TO-DIGITAL CONVERTER SYSTEM

[75] Inventor: Roy W. Lewallen, Beaverton, Oreg.

[73] Assignee: Tektronix, Inc., Wilsonville, Oreg.

[21] Appl. No.: 512,797

[22] Filed: Aug. 9, 1995

[51] Int. Cl.[6] .................................................. H03M 1/12
[52] U.S. Cl. ........................................ 341/155; 324/620
[58] Field of Search ................................. 341/155, 131, 341/118, 120; 324/620, 623

[56] References Cited

U.S. PATENT DOCUMENTS

| | | | |
|---|---|---|---|
| 4,447,803 | 5/1984 | Crosby et al. | 340/347 CC |
| 4,550,309 | 10/1985 | Hiller et al. | 340/347 AD |
| 4,568,878 | 2/1986 | Bales | 324/77 B |
| 4,761,634 | 8/1988 | Yamaguchi et al. | 340/347 AD |
| 4,791,577 | 12/1988 | Winter | 364/485 |
| 4,963,881 | 10/1990 | Franceschini | 341/131 |
| 5,134,399 | 7/1992 | Hiller | 341/131 |
| 5,168,459 | 12/1992 | Hiller | 364/724.19 |
| 5,172,059 | 12/1992 | Den Boef | 342/307 |
| 5,187,481 | 2/1993 | Hiller | 341/131 |
| 5,189,418 | 2/1993 | Bartz et al. | 341/131 |

*Primary Examiner*—Brian K. Young
*Attorney, Agent, or Firm*—Richard B. Preiss

[57] ABSTRACT

A spectrum analyzer (10, 70) employs a method of reducing the amplitude of harmonic and spurious signals (102, 104, 112) introduced into a frequency-domain output spectrum by, for example, nonlinearities in a mixer (12, 78) or an ADC (20, 92). The method employs acquiring and digitizing a normal time-domain data record of an input signal, transforming the time-domain data record to a normal frequency-domain record (30), and storing the normal record. Next, a local oscillator (14, 76) driving the mixer is frequency shifted, and an additional time-domain data record is acquired, digitized, transformed, and stored to produce a shifted frequency-domain data record (40). Then, the shifted data record is mathematically realigned (50) with the normal data record and the normal and realigned data records are combined to produce a frequency-domain data record (60) having reduced harmonic and spurious signal amplitudes. The method preferably employs multiple frequency shifts of the local oscillator and a corresponding number of acquisitions, digitizations, transformations, realignments, and averages.

30 Claims, 10 Drawing Sheets

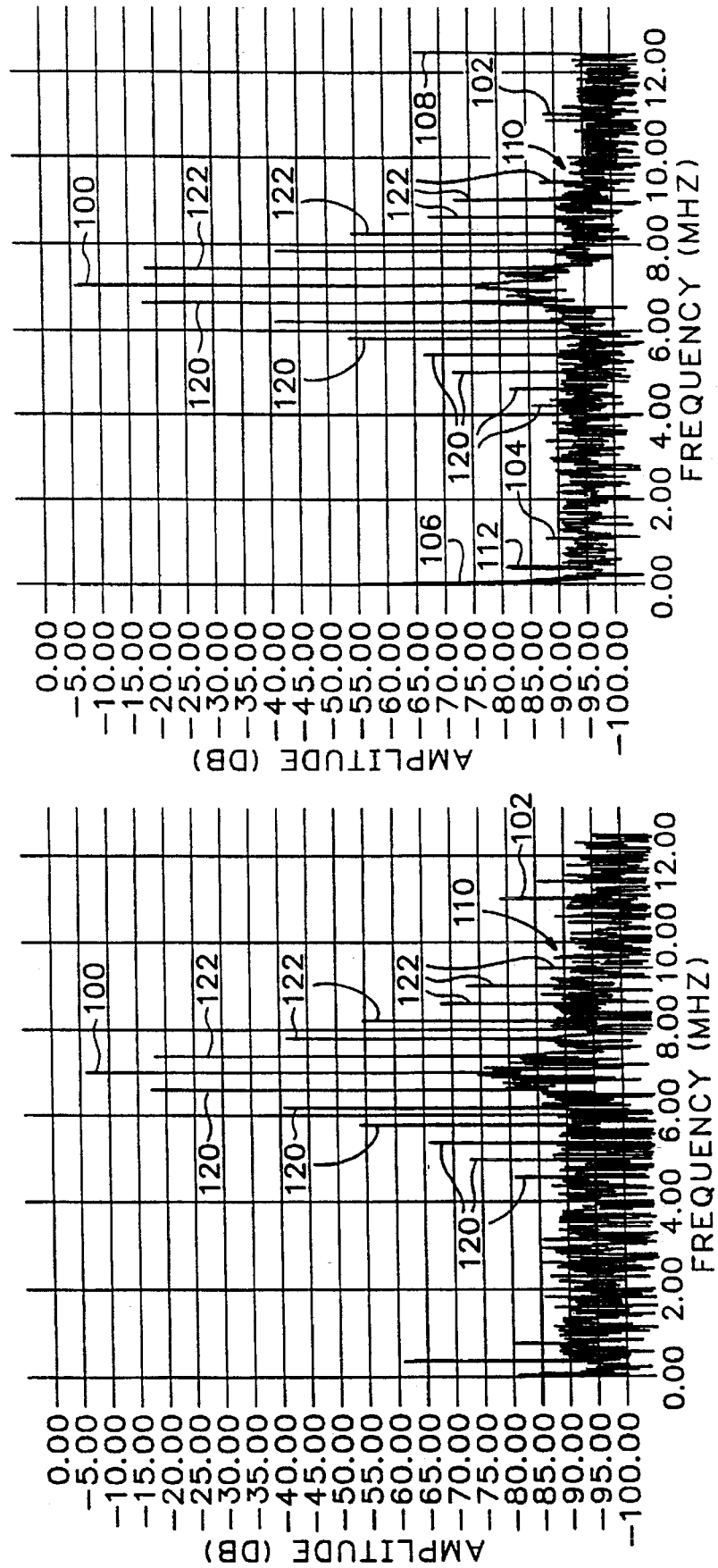

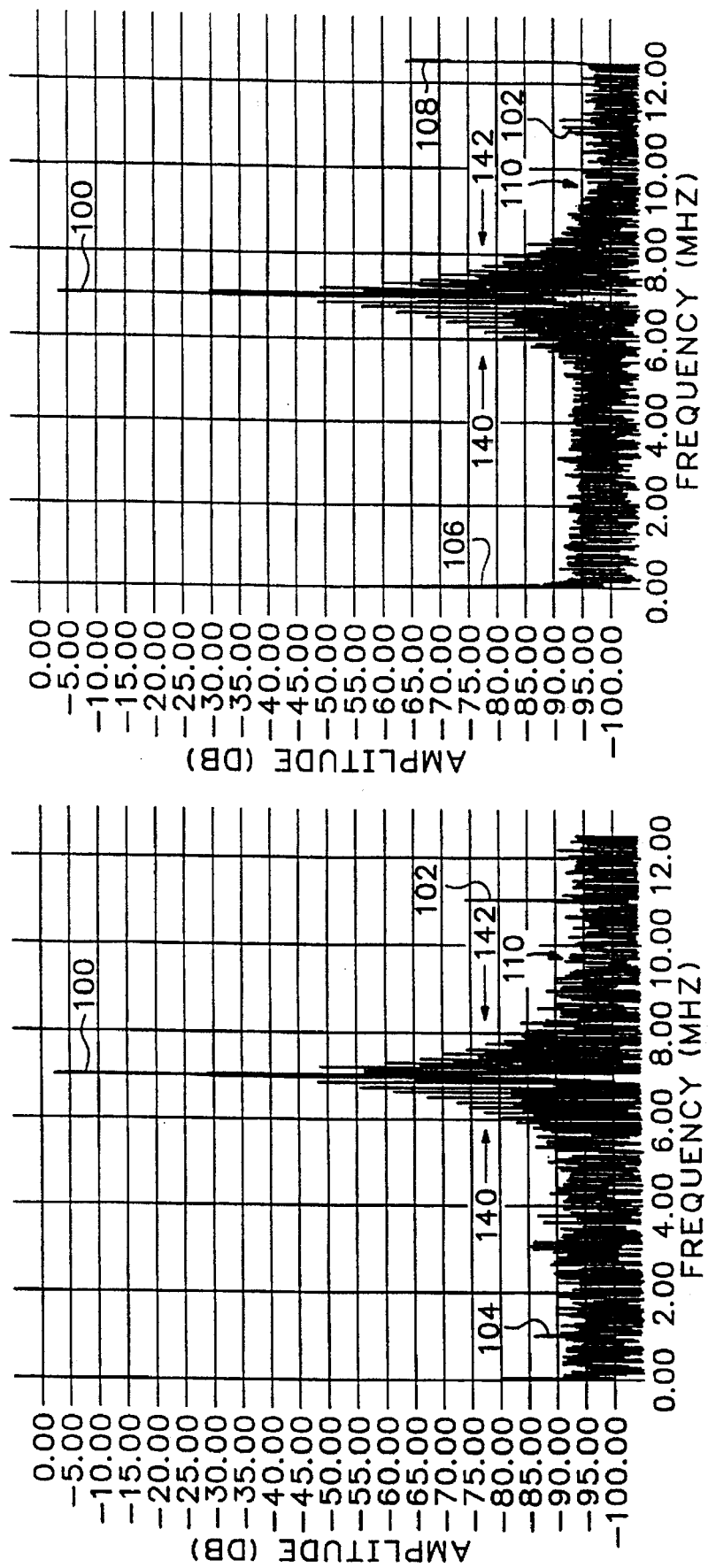

METHOD FOR REDUCING HARMONIC DISTORTION IN AN ANALOG-TO-DIGITAL CONVERTER SYSTEM

TECHNICAL FIELD

This invention relates to analog-to-digital converters and more particularly to a system and method for reducing harmonic distortion in a signal processing system employing an analog-to-digital converter.

BACKGROUND OF THE INVENTION

Harmonic distortion limits the usefulness of signal processing systems employing an analog-to-digital converter ("ADC"), such as spectrum analyzers and cable testers, because undesirable spurious signals are introduced at harmonic frequencies of an input signal.

A prior method of reducing ADC harmonic distortion employs adding high-level pseudo-random noise ("PRN") to the ADC input signal and subsequently subtracting the PRN from the ADC output signal. However this approach is disadvantageous because the high-level PRN reduces the maximum input signal amplitude that can be applied to the ADC, and the PRN is difficult to completely remove from the ADC output signal. U.S. Pat. Nos. 4,448,803, 4,550,309, 4,761,634, 4,963,881, 5,134,399, 5,168,459, 5,187,481, and 5,189,418 describe various techniques for removing the PRN from the ADC output signal or reducing distortion by related methods generally referred to as dithering.

Harmonic distortion can be introduced by many components, not just the ADC, of signal processing systems. For example, spectrum analyzers, cable testers, and other frequency-domain test sets typically employ amplifiers, filters, mixers, and local oscillators to acquire an input signal and further employ an ADC to digitize the acquired input signal for processing and display. Harmonic distortion in any of the acquisition and digitization stages can cause spurious signals to be displayed. Because it is very difficult to reduce harmonic distortion to negligible levels, prior workers have developed techniques for coping with the spurious signals. For example, U.S. Pat. No. 4,568,878 for SPECTRUM ANALYZERS, assigned to the assignee of this application, describes a local oscillator frequency shifting method that facilitates the identification and removal of spurious signals. However, such a method operates on predetermined spurious signals and does nothing to fundamentally reduce the overall level of spurious signals generated and displayed.

What is needed, therefore, is a system and method for reducing the amplitude of spurious signals in a system employing a frequency-conversion circuit and an ADC.

SUMMARY OF THE INVENTION

An object of this invention is, therefore, to provide a method for reducing the amplitude of spurious signals in frequency-domain test sets, such as spectrum analyzers and cable testers.

Another object of this invention is to provide a method for reducing the effects of harmonic distortion in an ADC digitizing a wide variety of signal types ranging from simple sinusoidal signals to spectrally complex signals, such as AM and FM modulated signals.

A preferred spectrum analyzer of this invention employs a method of reducing the amplitude of harmonic and spurious signals introduced into a frequency-domain output spectrum by, for example, nonlinearities in a mixer or an ADC. The method employs acquiring and digitizing a normal time-domain data record of an input signal, transforming the time-domain data record to a normal frequency-domain record, and storing the normal record. Next, a local oscillator driving the mixer is frequency shifted, and an additional time-domain data record is acquired, digitized, transformed, and stored to produce a shifted frequency-domain data record. Then, the shifted data record is mathematically realigned with the normal data record and the normal and realigned data records are combined to produce a frequency-domain data record having reduced harmonic and spurious signal amplitudes. The method preferably employs multiple frequency shifts of the local oscillator and a corresponding number of acquisitions, digitizations, transformations, realignments, and averages.

Additional objects and advantages of this invention will be apparent from the following detailed description of a preferred embodiment thereof that proceeds with reference to the accompanying drawings.

BRIEF DESCRIPTION OF THE DRAWINGS

FIGS. 8A to 8D are frequency versus amplitude diagrams of a series of output spectra resulting from processing an amplitude modulated input signal respectively zero, three, five, and nine times in the system of FIG. 6.

FIGS. 10A to 10D are frequency versus amplitude diagrams of a series of output spectra resulting from processing a 100 kHz square-wave frequency modulated input signal respectively zero, three, five, and nine times in the system of FIG. 6.

DETAILED DESCRIPTION OF A PREFERRED EMBODIMENT

Figure 1:
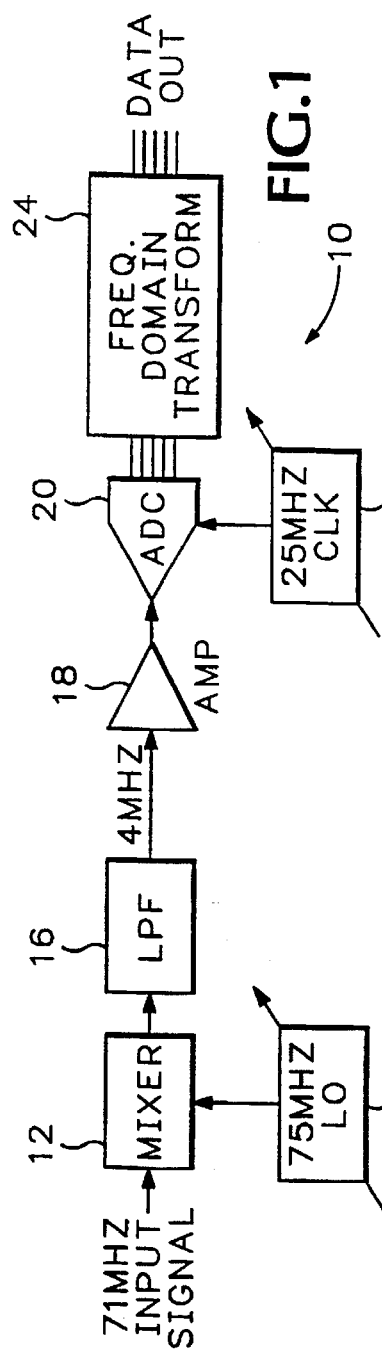
FIG. 1 is a simplified block circuit diagram of a spectrum analyzer that employs an ADC and a frequency-domain transform signal processor.

FIG. 1 shows a spectrum analyzer 10 in which a 71 megahertz ("MHz") input signal is converted in a mixer 12 to a 4 MHz intermediate-frequency ("IF") signal by mixing with a 75 MHz signal received from a local oscillator ("LO")

14. A low-pass filter ("LPF") 16 and an amplifier 18 condition the 4 MHz signal for digitization by an ADC 20 that has a 25 MHz conversion rate that is determined by a clock 22. A frequency-domain transform processor 24, such as a fast Fourier transform unit, provides frequency spectrum data representative of the 71 MHz input signal for further processing and/or display. Spectrum analyzer 10 has a maximum non-aliased output frequency that is limited to one-half the 25 MHz frequency of clock 22. This frequency limit is referred to as the Nyquist limit, which in this example is 12.5 MHz.

Figure 2:
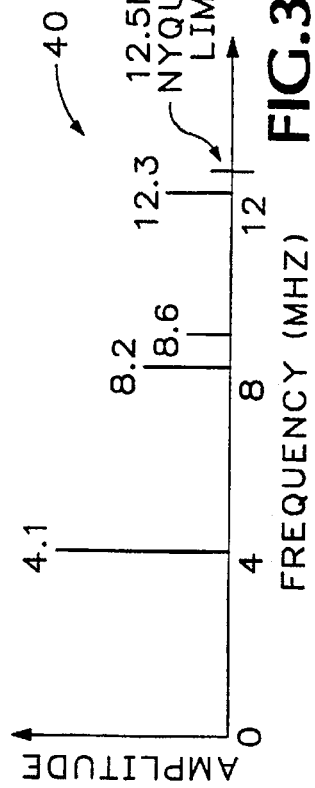
FIG. 2 is a frequency versus amplitude diagram showing a normal frequency-domain output spectrum of the spectrum analyzer of FIG. 1.

FIG. 2 shows an exemplary normal output frequency spectrum 30 of spectrum analyzer 10. Because mixer 12, amplifier 18, and ADC 20 all have nonlinearities, they may each or in combination generate 8, 12, 16, 20 MHz or higher harmonics of the 4 MHz input signal. In addition, harmonics above the Nyquist limit of ADC 20 are aliased by the digitizing process such that, for example, the 16 MHz harmonic appears as a 9 MHz spurious frequency in normal output frequency spectrum 30. The 9 MHz spurious frequency is generated by mixing the 16 MHz harmonic with the 25 megahertz digitization clock frequency. Harmonics and spurious frequencies above 12.5 MHz, although they may be present, are not shown in FIG. 2.

Spectrum analyzer 10 may be modified and operated to reduce the amplitude of harmonics and spurious frequencies in the output frequency spectrum. LO 14 and/or clock 22 are operable at various predetermined frequencies, and frequency-domain transform processor 24 or a data processor (not shown) provide a signal storage and averaging process.

The harmonic and spurious frequency reduction process is described below with reference to FIGS. 1–5.

Frequency-domain transform processor 24 stores normal output frequency spectrum 30 (FIG. 2) for subsequent processing.

LO 14 is frequency shifted by a predetermined amount, such as 0.1 MHz, to 75.1 MHz. Consequently, the 71 MHz input signal is converted in mixer 12 to a 4.1 MHz IF signal by mixing with the 75.1 MHz signal received from LO 14. LPF 16 and amplifier 18 condition the 4.1 MHz signal for digitization and processing by ADC 20 and frequency-domain transform processor 24.

Figure 3:
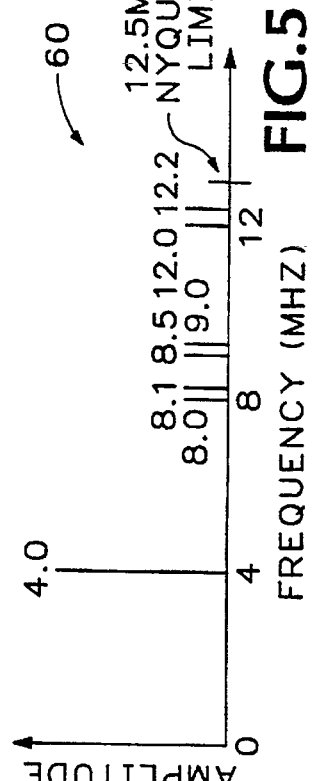
FIG. 3 is a frequency versus amplitude diagram showing a frequency-shifted output spectrum of a spectrum analyzer signal processing method of this invention.

FIG. 3 shows a frequency-shifted output frequency spectrum 40 of spectrum analyzer 10 that results from shifting the frequency of LO 14. Shifted output frequency spectrum 40 includes the 4.1 MHz IF signal, 8.2 and 12.3 MHz harmonics, and an 8.6 MHz spurious frequency signal that is generated by mixing a 16.4 MHz harmonic with the 25 MHz digitization clock frequency.

Frequency-domain transform processor 24 stores shifted output frequency spectrum 40 (FIG. 3) for subsequent processing.

Figure 4:
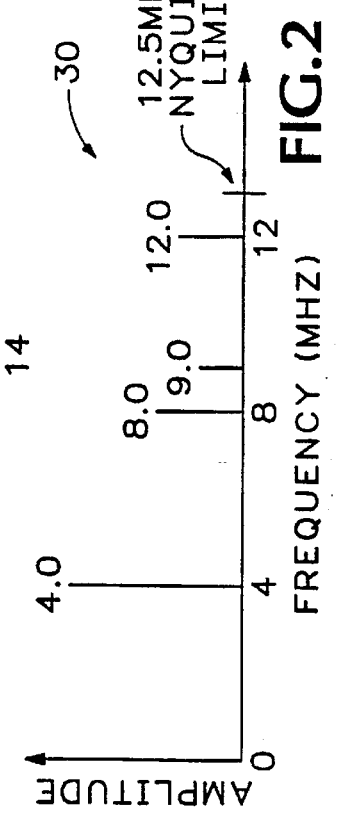
FIG. 4 is a frequency versus amplitude diagram showing a frequency-realigned output spectrum of a spectrum analyzer signal processing method of this invention.

As shown in FIG. 4, frequency-domain transform processor 24 realigns shifted output frequency spectrum 40 (FIG. 3) by mathematically shifting it 0.1 megahertz down in frequency to generate and store a realigned output frequency spectrum 50. Realignment restores the 4.1 MHz IF signal to its original 4 MHz frequency and shifts the harmonic and spurious signal frequencies respectively to 8.1, 12.2, and 8.5 MHz.

Frequency-domain transform processor 24 stores realigned output frequency spectrum 50 (FIG. 4) for subsequent processing. Stored shifted output frequency spectrum 40 (FIG. 3) may optionally be deleted or written during the realignment process.

Figure 5:
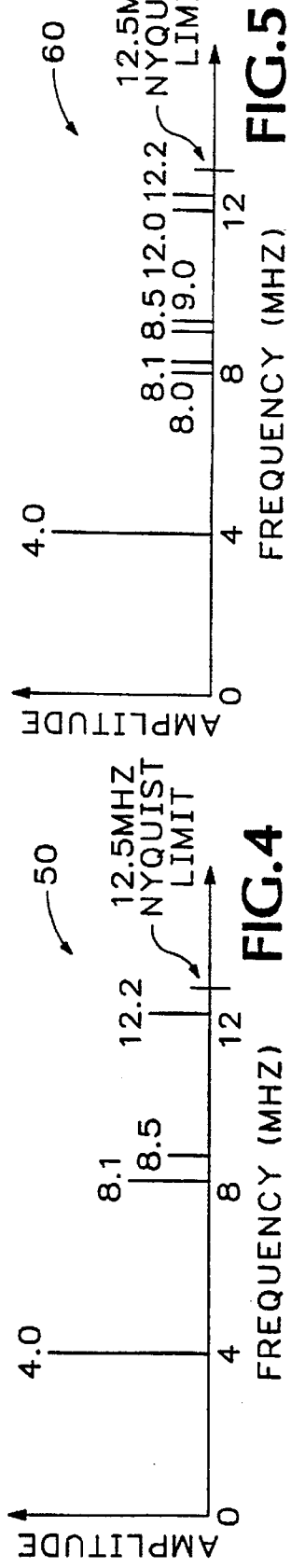
FIG. 5 is a frequency versus amplitude diagram showing a reduced distortion output spectrum of a spectrum analyzer signal processing method of this invention.

As shown in FIG. 5, frequency-domain transform processor 24 combines, preferably by mathematically averaging, stored normal output frequency spectrum 30 (FIG. 2) and stored realigned output frequency spectrum 50 (FIG. 4) to provide an averaged output frequency spectrum 60. Notably, the harmonic and spurious frequency signals have been spread out in frequency and reduced in amplitude, while the 4.0 MHz signal is unchanged in frequency or amplitude from its original values shown in FIG. 2.

A further frequency spreading and amplitude reduction of the harmonic and spurious frequency signals can be accomplished by shifting LO 14 to another frequency or frequencies; acquiring, storing, and realigning the related additional frequency spectra data; and including the additional frequency spectra data in a final averaged output frequency spectrum.

The amount of frequency shift employed should be sufficient to generate multiple output frequency spectra having frequency components spaced far enough apart to be separately distinguishable. The actual amount depends on the effectiveness of the windowing process employed by frequency domain transform processor 24.

Of course, the above-described process depends on the input signal staying substantially constant during the acquisition and storage of multiple output frequency spectra.

Figure 6:
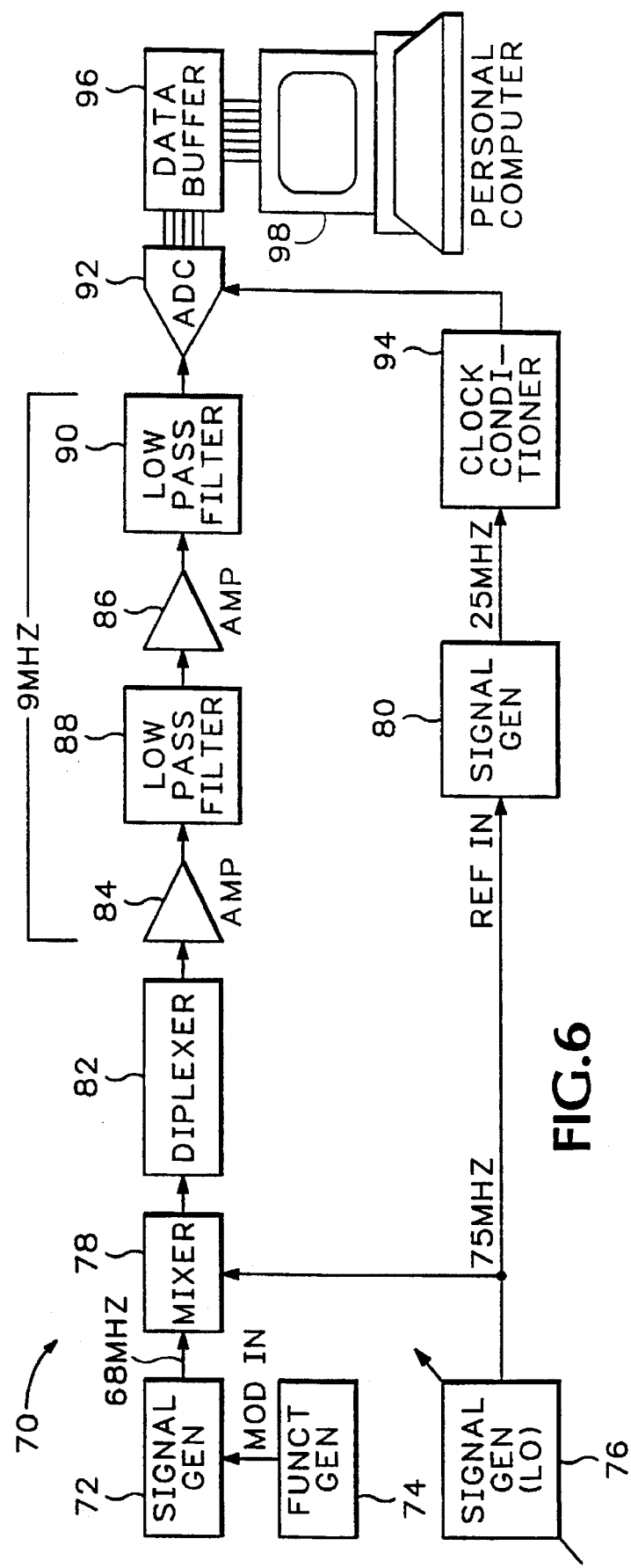
FIG. 6 is a simplified block circuit diagram of an experimental spectrum analyzer system employed to test the distortion reduction method of this invention.

The effectiveness of the above-described process was verified by employing it in an experimental spectrum analyzer system 70 shown in FIG. 6. A signal generator 72 generates a 68 MHz input signal that is optionally modulated by a function generator 74, such as a Simpson, model 420. A variable frequency signal generator 76 generates a 75 MHz signal that is received by a mixer 78 and a reference input of a 25 MHz signal generator 80. An incoherent input signal is simulated by intentionally not referencing signal generator 72 to signal generators 76 and 80.

Mixer 78 produces a 7 MHz IF signal that is conditioned by a diplexer 82 for amplification and filtering by an IF amplifier including amplifiers 84 and 86 and 9 MHz LPFs 88 and 90.

An Analog Devices, Inc. type AD9026 ADC 92 receives the amplified and filtered 7 MHz IF signal and digitizes it into time-domain data in response to the 25 MHz clock signal generated by signal generator 80 and shaped into a square-wave by a clock conditioner 94. The time-domain data generated by ADC 92 are received by a data buffer 96 installed in a processor 98, such as a conventional personal computer, for data acquisition, transform processing, display, and printing of output frequency spectra derived from experimental spectrum analyzer system 70.

Four different input signal spectra were processed to varying degrees by this invention in experimental spectrum analyzer system 70 of FIG. 6. The processing method employed the following steps.

Set signal generator 72 to a 68 MHz carrier frequency.

Set function generator 74 to modulate signal generator 72 to generate one of four different experimental input signal spectra, preferably including no modulation, 400 kHz square-wave amplitude modulation, 10 kHz square-wave frequency modulation, and 100 kHz square-wave frequency modulation.

Acquire and digitize a normal time-domain data record of the 68 MHz input signal with signal generator 76 set at 75 MHz.

Perform a fast Fourier transform on the time-domain data record and store the resulting normal frequency-domain record.

Acquire, digitize, and store multiple shifted data records of the 68 MHz input signal with signal generator 76 set at 75 MHz ±1, ±2, ±3 and ±4 increments, where one increment is 48,828 hertz, which equals eight frequency divisions in a 4,096 sample frequency transformed data record.

Perform a fast Fourier transform on each of the shifted time-domain data records and store the resulting shifted frequency-domain records.

Mathematically realign each of the shifted frequency-domain data records to compensate for the frequency shifts of signal generator 76. For example, if a shifted record is acquired with signal generator 76 shifted +1 increment to 75.048828 MHz realigning the shifted record downward in frequency by 48,828 hertz will restore the fundamental center frequency of the signal back to 7 Mhz.

Mathematically average the normal frequency-domain data record and one or more of the shifted frequency-domain data records. The final averaged frequency-domain data records employed in these experiments include the average of three, five, and nine signal acquisitions.

Repeat the process for a different experimental input signal spectra.

The averaging of the shifted frequency-domain data records was accomplished after the data were converted to decibels ("dB"). Alternatively, the averaging could be done before the dB conversion, resulting in different harmonic distortion and spurious frequency reduction characteristics. Also, other mathematical transform functions could operate on the frequency-domain data records before averaging and then be reverse transformed to achieve a predetermined data weighing. Moreover, processes other than averaging could be employed to combine the shifted frequency-domain data records into a single record.

Figure 7B:
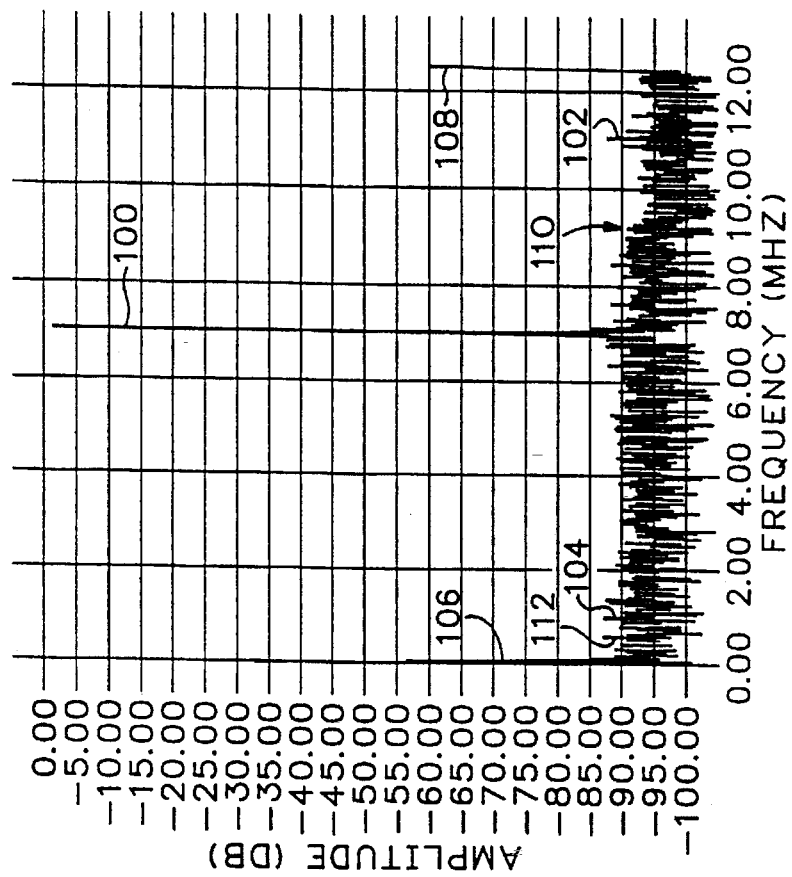
FIGS. 7A to 7D are frequency versus amplitude diagrams of a series of output spectra resulting from processing an unmodulated sinusoidal input signal respectively zero, three, five, and nine times in the system of FIG. 6.
Figure 7A:
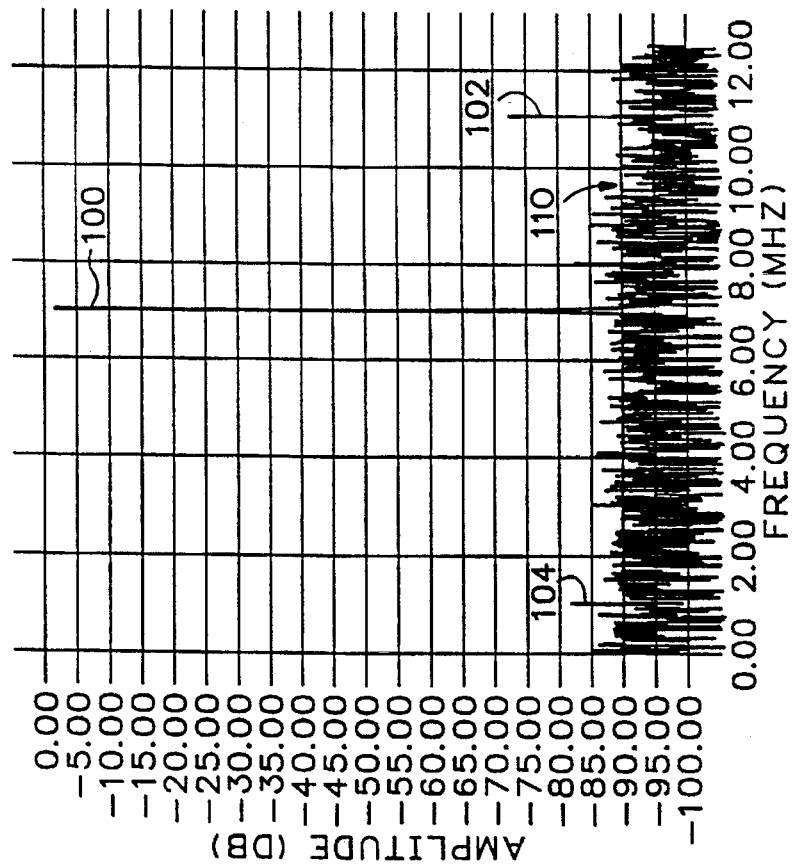

FIG. 7A shows a normal frequency-domain data record of 4,096 samples acquired and processed for the unmodulated 75 MHz input signal. Mixer 78 combines the 68 MHz input signal and the 75 MHz signal to produce a 7 MHz center frequency signal 100. The 14 MHz second harmonic is aliased by the 25 MHz digitization rate of ADC 92 to form an 11 MHz spurious signal 102. A 1 MHz spurious signal 104 is apparently a 49 MHz seventh harmonic of 7 MHz center frequency signal 100 aliased by the 50 MHz second harmonic of the 25 MHz digitization rate of ADC 92. FIG. 7A shows a "spur-free" dynamic range of about 70 dB.

FIG. 7B shows the frequency-domain data record that results by averaging the frequency-domain data record of FIG. 7A with two frequency-shifted and realigned data records taken with signal generator 76 set at 75 MHz ±1 increment. With only three records being averaged, the spur-free dynamic range was increased to about 85 dB.

Large spikes 106 and 108 at 0 MHz and 12.5 MHz are data artifacts caused by averaging the normal record with invalid data created at the frequency extremes when a shifted record is realigned. In a commercial embodiment of this invention, a dedicated processing system would be programmed to ignore the invalid data such that only valid data are included in the final average.

A downward step 110 in the noise at about 9 MHz is caused by 9 MHz LPFs 88 and 90 reducing noise, and harmonic signals originating from signal generators 72 and 76, mixer 78, and amplifiers 84 and 86.

A data artifact 112 at about 0.5 MHz is apparently interference injected into experimental spectrum analyzer system 70 from an unknown source.

Figure 7D:
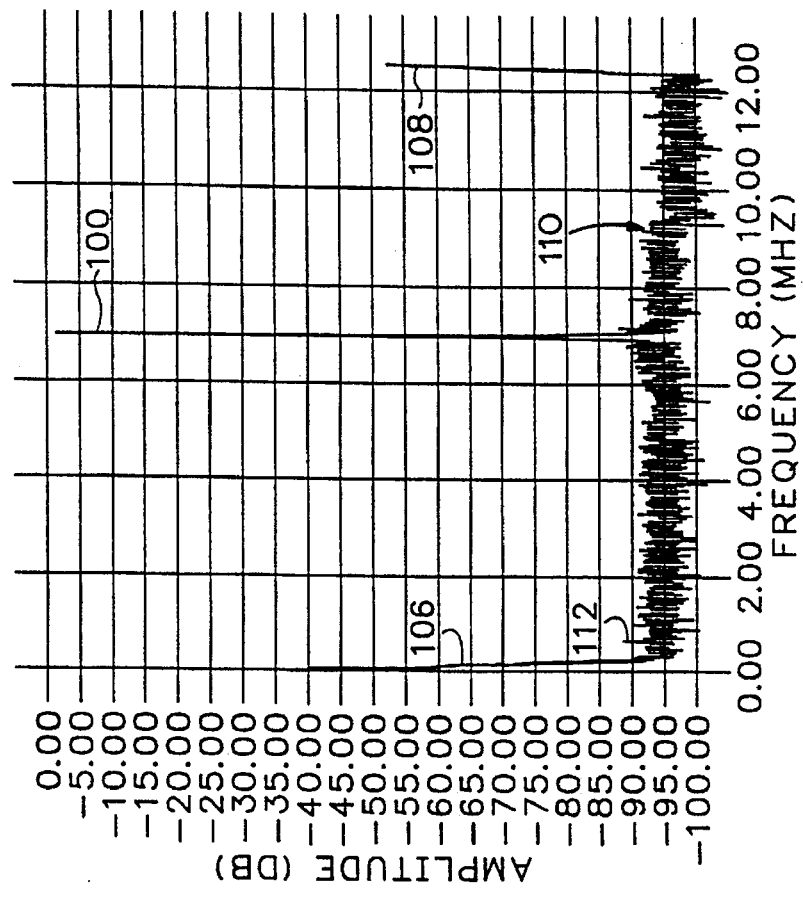
Figure 7C:
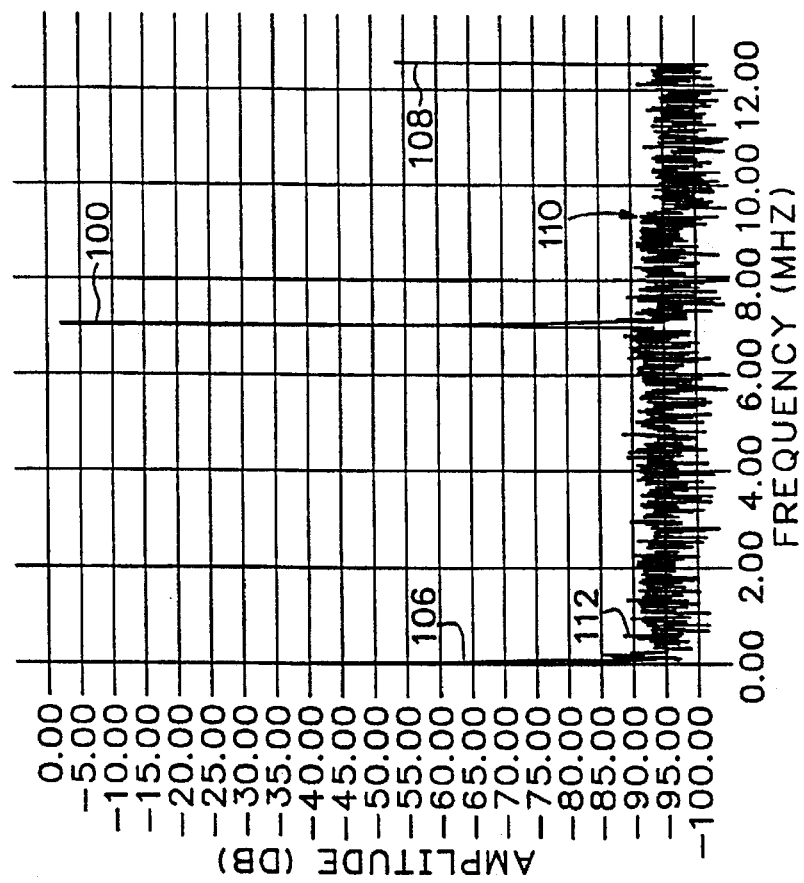

FIG. 7C shows the frequency-domain data record that results by averaging the frequency-domain data record of FIG. 7A with four frequency-shifted and realigned data records taken with signal generator 76 set at 75 MHz ±1 and ±2 increments.

FIG. 7D shows the frequency-domain data record that results by averaging the frequency-domain data record of FIG. 7A with eight frequency-shifted and realigned data records taken with signal generator 76 set at 75 MHz ±1, ±2, ±3, and ±4 increments.

FIGS. 7B to 7D show that the reduction in the amplitude of harmonics and spurious frequencies present in final average frequency-domain data records increases as the number of data records averaged increases. Of course, skilled workers will recognize that the noise converges toward its average value.

The experiment was repeated with signal generator 72 modulated by function generator 74 to produce 400 kHz square-wave amplitude modulation, 10 kHz square-wave frequency modulation, and 100 kHz square-wave frequency modulation.

FIG. 8A shows a normal frequency-domain data record of 4,096 samples acquired and processed for the 400 kHz square-wave amplitude modulated 75 MHz input signal. As before, the mixing process generates 7 MHz center frequency signal 100, but the 400 kHz modulation produces lower sidebands 120 and upper sidebands 122 spaced 400 kHz apart from each other. Again present to various degrees are 11 MHz spurious signal 102, 1 MHz spurious signal 104, and downward step 110. A genuine spurious signal 113 masks the data artifact 112 at approximately 0.5 MHz FIG. 8B shows the frequency-domain data record that results by averaging the frequency-domain data record of FIG. 8A with two frequency-shifted and realigned data records taken with signal generator 76 set at 75 MHz ±1 increment. The spur free dynamic range has increased from 55 dB to 75 dB.

Figure 8D:
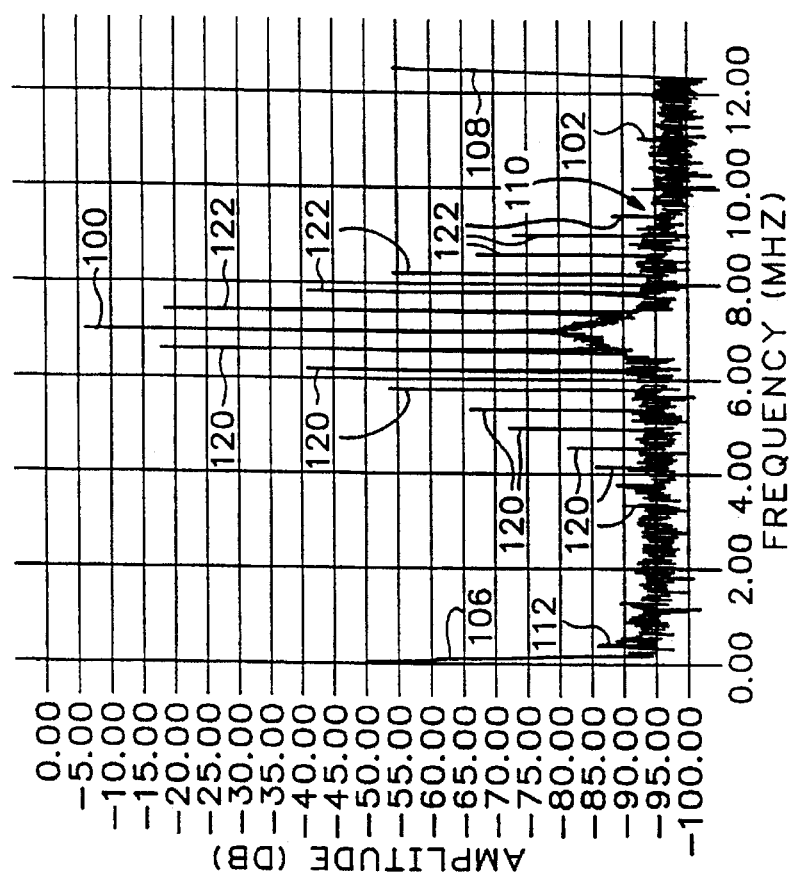
Figure 8C:
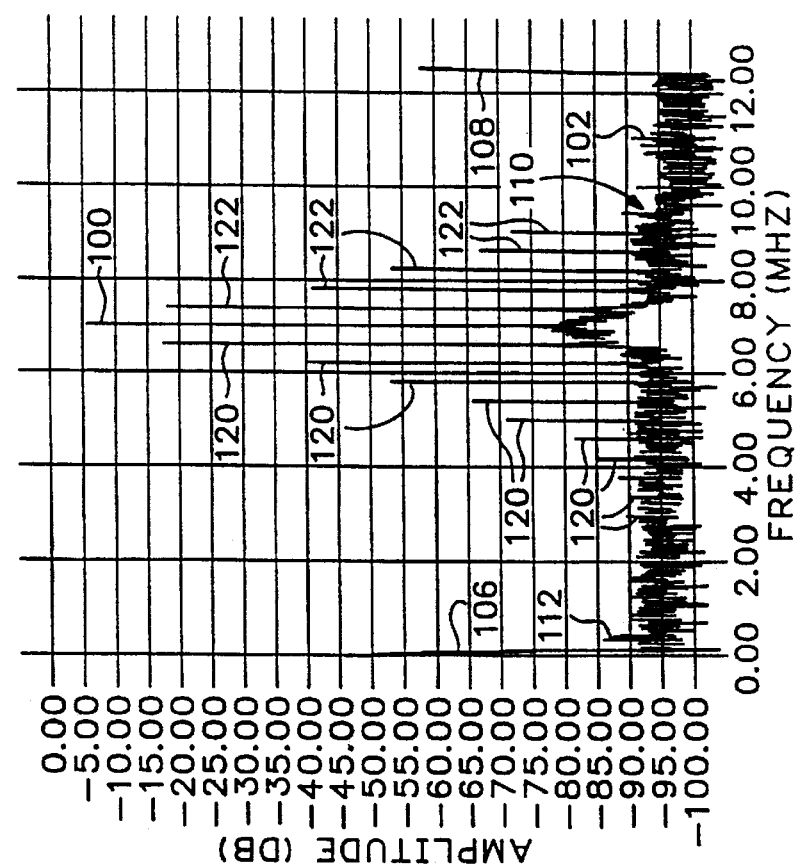

FIG. 8C shows the frequency-domain data record that results by averaging the frequency-domain data record of FIG. 8A with four frequency-shifted and realigned data records taken with signal generator 76 set at 75 MHz ±1 and ±2 increments.

FIG. 8D shows the frequency-domain data record that results by averaging the frequency-domain data record of FIG. 8A with eight frequency-shifted and realigned data records taken with signal generator 76 set at 75 MHz ±1, ±2, ±3, and ±4 increments.

Note that as an increasing number of data records are averaged, an increasing number of lower sidebands 120 become visible above the noise. In particular, in FIG. 8A only six of lower sidebands 120 are clearly visible, whereas in FIG. 8D, nine of lower sidebands 120 are clearly visible. More upper sidebands 122 would become visible too except that sidebands occurring above 9 MHz are effectively removed from the input signal by LPFs 88 and 90 (FIG. 6).

Figure 9B:
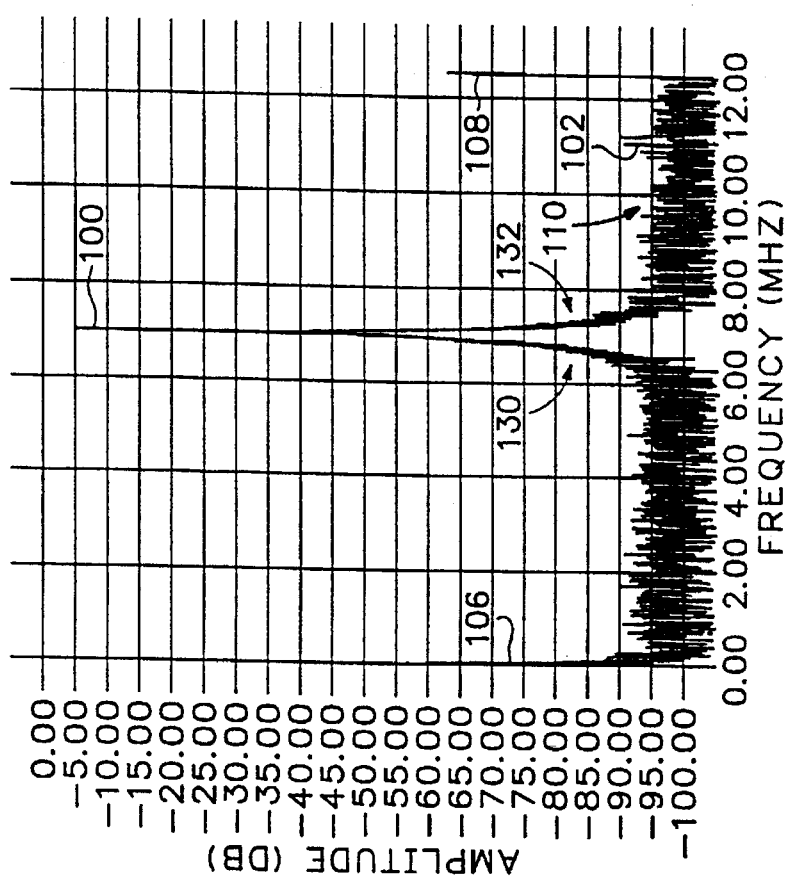
FIGS. 9A to 9D are frequency versus amplitude diagrams of a series of output spectra resulting from processing a 10 kilohertz ("kHz") square-wave frequency modulated input signal respectively zero, three, five, and nine times in the system of FIG. 6.
Figure 9A:
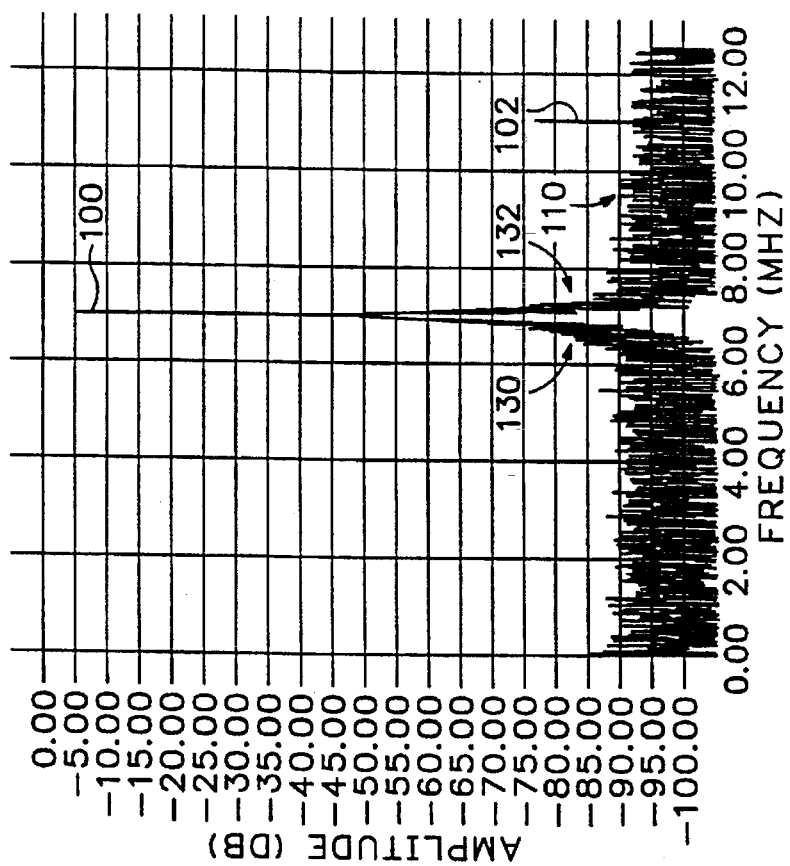

FIG. 9A shows a normal frequency-domain data record of 4,096 samples acquired and processed for the 10 kHz square-wave frequency modulated 75 MHz input signal. As before, mixer 78 generates 7 MHz center frequency signal 100, but the 10 kHz modulation produces lower sidebands 130 and upper sidebands 132 spaced 10 kHz apart from each other, a spacing so close that the sidebands appear as high-density noise (compare with FIG. 7A, which has no sidebands). Again present to various degrees are 11 MHz spurious signal 102, large spikes 106 and 108, downward step 110, and 0.5 MHz data artifact 112.

FIG. 9B shows the frequency-domain data record that results by averaging the frequency-domain data record of FIG. 9A with two frequency-shifted and realigned data records taken with signal generator 76 set at 75 MHz ±1 increment.

Figure 9D:
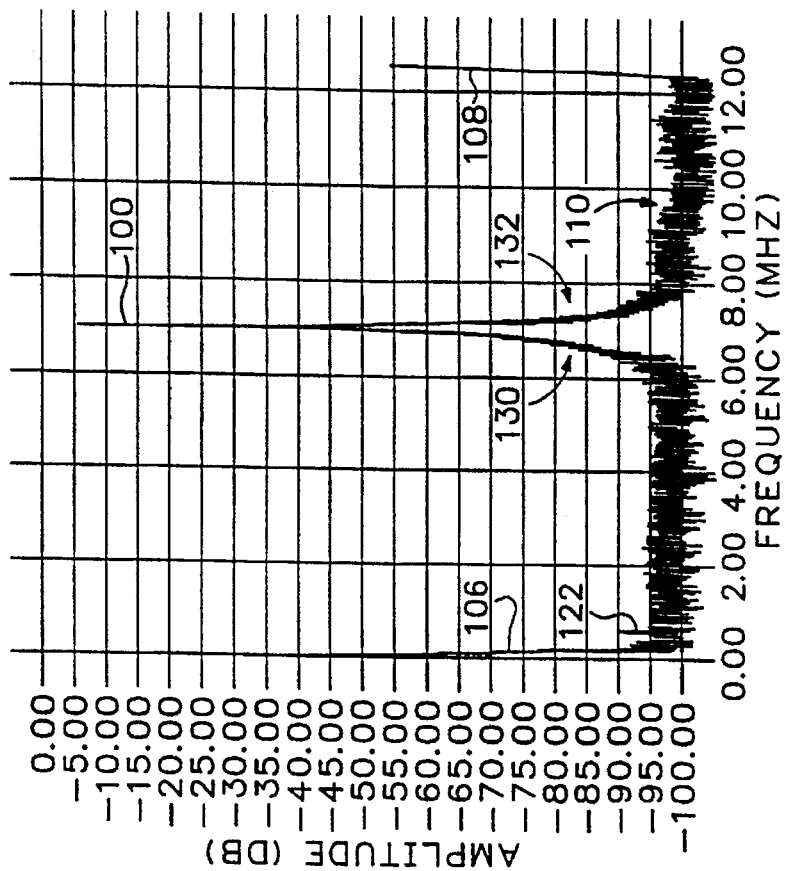
Figure 9C:
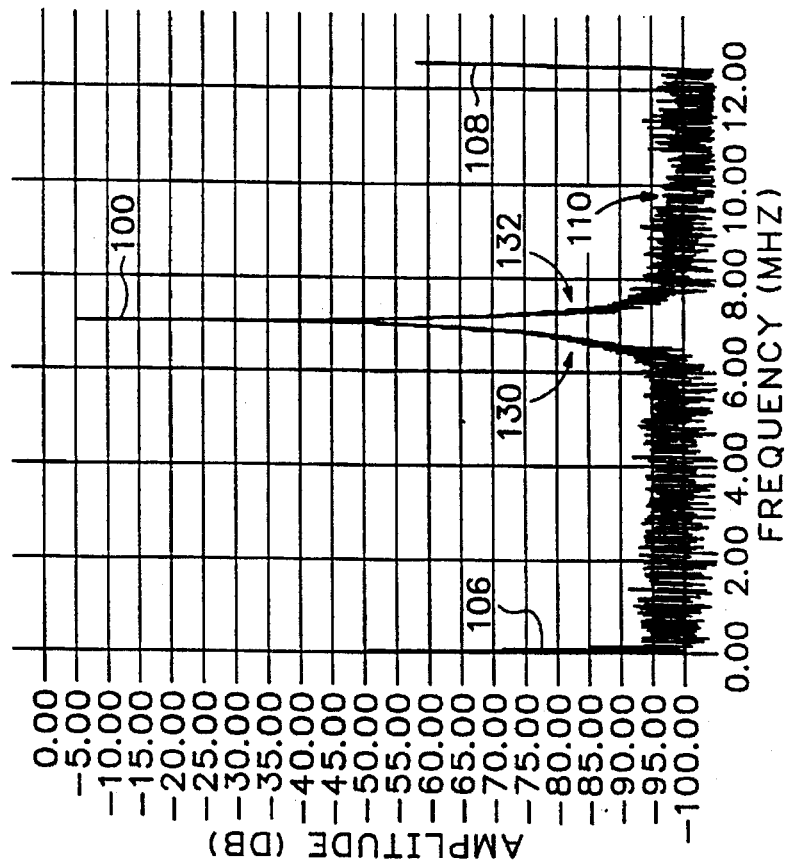

FIG. 9C shows the frequency-domain data record that results by averaging the frequency-domain data record of FIG. 9A with four frequency-shifted and realigned data records taken with signal generator 76 set at 75 MHz ±1 and ±2 increments.

FIG. 9D shows the frequency-domain data record that results by averaging the frequency-domain data record of FIG. 9A with eight frequency-shifted and realigned data records taken with signal generator 76 set at 75 MHz ±1, ±2, ±3, and ±4 increments.

FIG. 10A shows a normal frequency-domain data record of 4,096 samples acquired and processed for the 100 kHz square-wave frequency modulated 75 MHz input signal. As before, mixer 78 generates 7 MHz center frequency signal 100, but the 100 kHz modulation produces lower sidebands 140 and upper sidebands 142 spaced 100 kHz apart from each other. Again present to various degrees are 11 MHz spurious signal 102, 1 MHz spurious signal 104, large spikes 106 and 108, downward step 110, and 0.5 MHz data artifact 112.

FIG. 10B shows the frequency-domain data record that results by averaging the frequency-domain data record of FIG. 10A with two frequency-shifted and realigned data records taken with signal generator 76 set at 75 MHz ±1 increment.

Figure 10D:
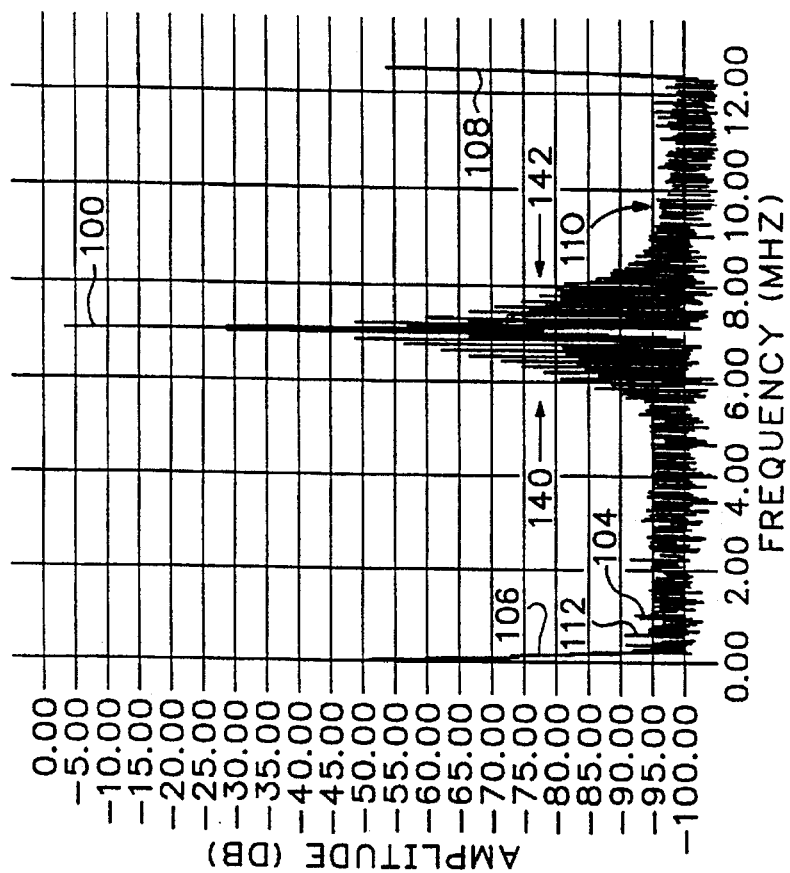
Figure 10C:
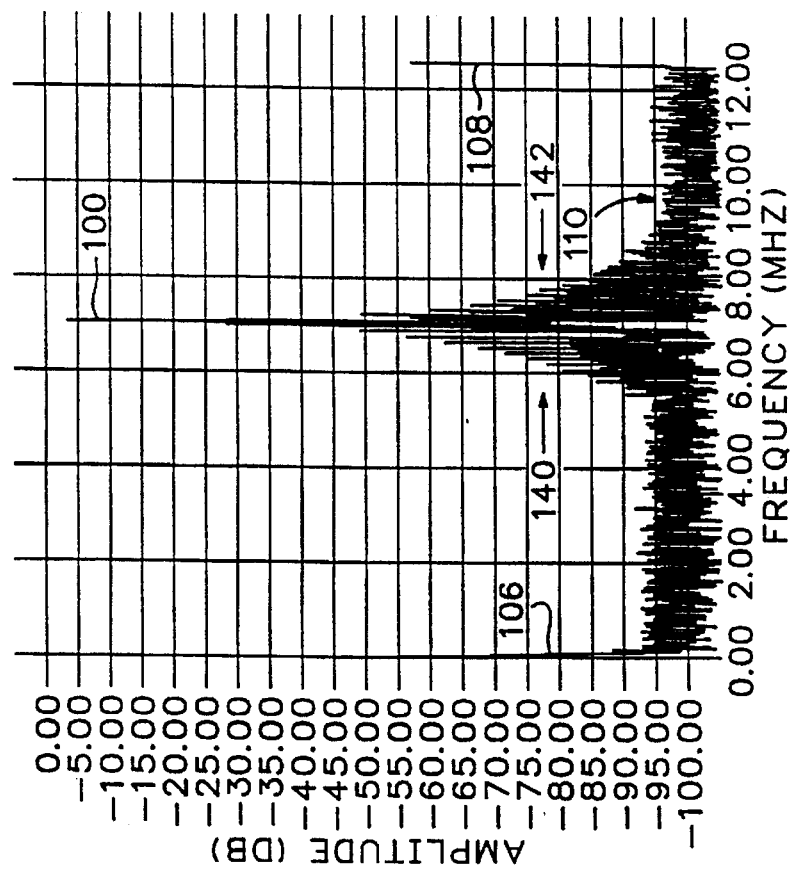

FIG. 10C shows the frequency-domain data record that results by averaging the frequency-domain data record of FIG. 10A with four frequency-shifted and realigned data records taken with signal generator 76 set at 75 MHz ±1 and ±2 increments.

FIG. 10D shows the frequency-domain data record that results by averaging the frequency-domain data record of FIG. 10A with eight frequency-shifted and realigned data records taken with signal generator 76 set at 75 MHz ±1, ±2, ±3, and ±4 increments.

Note that as an increasing number of data records are averaged, an increasing number of sidebands become visible above the noise. In particular, in FIG. 10A only sidebands occurring between about 6 MHz and about 7.5 MHz are clearly visible, whereas in FIG. 10D sidebands occurring between about 5.5 MHz and about 8.5 MHz are clearly visible. As before, more of upper sidebands 142 would become visible too except that sidebands occurring above 9 MHz are effectively removed from the input signal by LPFs 88 and 90 (FIG. 6).

In all four sets of experimental results, employing this invention provides significant reductions in the amplitude of harmonic and spurious signals, with usable reductions realized by averaging as few as three frequency-domain data records.

Skilled workers will recognize that portions of this invention may be implemented differently from the implementations described above for a preferred embodiment. For example, signal generator 76 may be of a type having a programmable frequency such that the frequency may be determined by a program running in personal computer 98. Also, shifting the digitization rate of ADC 92 instead of signal generator 76 will reduce the amplitude of ADC-generated harmonics having frequencies above the Nyquist limit of ADC 92 (12.5 megahertz in experimental spectrum analyzer system 70). If input signals digitized by ADC 92 are frequency limited to being above one-half of the Nyquist limit (one-fourth of the ADC digitization rate), all harmonics generated by ADC 92 are reduced by this embodiment of the invention.

The method of this invention can be employed with signal values representing voltages, dBs, or other mathematical functions of the input signal. It may also be beneficial to convert the values by some mathematical function, average the converted values, then operate on the results with the inverse of the mathematical function. Combining the waveforms other than by averaging will produce differing amounts of harmonic and spurious signal reduction and may be more suitable for some applications.

Of course, a wide range of signal modulation types, signal frequencies, spectrum analyzer configurations, frequency-domain test sets, cable testers, and signal processing types may be successfully employed with this invention.

It will be obvious, therefore, to skilled workers, that many changes may be made to the details of the above-described embodiment of this invention without departing from the underlying principles thereof. Accordingly, it will be appreciated that this invention is also applicable to analog-to-digital conversion applications other than those found in spectrum analyzers. The scope of the present invention should, therefore, be determined only by the following claims.

I claim:

1. In a system including an analog-to-digital converter, a method for reducing an amplitude of a distortion-generated signal related to an input signal, comprising:

digitizing a signal spectrum of the input signal with the analog-to-digital converter to provide a normal frequency-domain data record having a first center frequency datum with a first amplitude and a first distortion-generated signal datum with a second amplitude;

shifting a frequency spectrum of the digitized input signal to provide a shifted frequency-domain data record having a second center frequency datum with the first amplitude and a second distortion-generated signal datum with the second amplitude;

realigning the shifted frequency-domain data record to provide a realigned frequency-domain data record having a realigned center frequency substantially equaling the first center frequency; and combining the normal frequency-domain data record and the realigned frequency-domain data record to provide a combined frequency-domain data record in which the combined first and realigned center frequency data have substantially the first amplitude and the first and second distortion-generated signal data each have a third amplitude that is less than the second amplitude.

2. The method of claim 1 in which the system is one of a spectrum analyzer, a cable tester, and a frequency-domain test set.

3. The method of claim 1 in which the system further includes a local oscillator and a mixer and the digitizing step further includes:

setting the local oscillator to a first frequency; and converting in the mixer the input signal to the signal spectrum of the input signal.

4. The method of claim 3 in which the shifting step further includes setting the local oscillator to a second frequency.

5. The method of claim 1 in which the digitizing and shifting steps each further include a transforming step for providing respectively the normal and shifted frequency-domain data records.

6. The method of claim 5 in which the transforming steps includes a fast Fourier transform.

7. The method of claim 1 in which the digitizing step further includes a storing step for storing the normal frequency-domain data record.

8. The method of claim 1 in which the shifting step further includes a storing step for storing the shifted frequency-domain data record.

9. The method of claim 1 in which the system further includes a processor and the realigning step is carried out by the processor operating on the shifted frequency-domain data record to provide the realigned frequency-domain data record.

10. The method of claim 1 in which the system further includes a processor and the combining step is carried out by the processor mathematically averaging the normal frequency-domain data record and the realigned frequency-domain data record.

11. The method of claim 1 in which the first, second, and third amplitudes each have values expressed in decibels.

12. In a system including an analog-to-digital converter, a method for reducing an amplitude of a distortion-generated signal related to an input signal, comprising:

digitizing a signal spectrum of the input signal with the analog-to-digital converter to provide a normal frequency-domain data record having a first center frequency datum with a first amplitude and a first distortion-generated signal datum with a second amplitude;

shifting by multiple amounts a frequency spectrum of the digitized input signal to provide multiple corresponding shifted frequency-domain data records each having a corresponding second center frequency with the first amplitude and a corresponding second distortion-generated signal datum with the second amplitude;

realigning the multiple shifted frequency-domain data records to provide multiple corresponding realigned frequency-domain data records each having a realigned center frequency substantially equaling the first center frequency; and combining the normal frequency-domain data record and the multiple realigned frequency-domain data records to provide a combined frequency-domain data record in which the combined first and multiple realigned center frequency data have substantially the first amplitude and the first and multiple second distortion-generated signal data each have a third amplitude that is less than the second amplitude.

13. The method of claim 12 in which the system is one of a spectrum analyzer, a cable tester, and a frequency-domain test set.

14. The method of claim 12 in which the system further includes a local oscillator and a mixer and the digitizing step further includes:

setting the local oscillator to a first frequency; and converting in the mixer the input signal to the signal spectrum of the input signal.

15. The method of claim 14 in which the shifting step further includes setting the local oscillator to multiple corresponding second frequencies.

16. The method of claim 12 in which the digitizing step further includes a storing step for storing the normal frequency-domain data record.

17. The method of claim 12 in which the shifting step further includes multiple corresponding storing steps for storing each of the shifted frequency-domain data records.

18. The method of claim 12 in which the system further includes a processor and the realigning step is carried out by the processor operating on each of the multiple shifted frequency-domain data records to provide the multiple realigned frequency-domain data records.

19. The method of claim 12 in which the system further includes a processor and the combining step is carried out by the processor mathematically averaging the normal frequency-domain data record and the multiple realigned frequency-domain data records.

20. In a signal processing system, apparatus for reducing an amplitude of a distortion-generated signal related to an input signal, comprising:

an analog-to-digital converter digitizing a signal spectrum of the input signal to provide a normal frequency-domain data record having a first center frequency datum with a first amplitude and a first distortion-generated signal datum with a second amplitude;

shifting means for shifting a frequency spectrum of the digitized input signal to provide a shifted frequency-domain data record having a second center frequency datum with the first amplitude and a second distortion-generated signal datum with the second amplitude;

a processor realigning the shifted frequency-domain data record to provide a realigned frequency-domain data record having a realigned center frequency substantially equaling the first center frequency, and the processor combining the normal frequency-domain data record and the realigned frequency-domain data record to provide a combined frequency-domain data record in which the combined first and realigned center frequency data have substantially the first amplitude and the first and second distortion-generated signal data each have a third amplitude that is less than the second amplitude.

21. The apparatus of claim 20 in which the signal processing system is one of a spectrum analyzer, a cable tester, and a frequency-domain test set.

22. The apparatus of claim 20 in which the shifting means includes a variable frequency local oscillator and a mixer with which the local oscillator is set to at least a first frequency, and the mixer converts the input signal to the signal spectrum of the input signal.

23. The apparatus of claim 22 in which the local oscillator is further settable to at least a second frequency.

24. The apparatus of claim 23 in which the local oscillator is settable by the processor to at least the first and second frequencies.

25. The apparatus of claim 20 in which the shifting means includes a variable frequency signal generator with which the analog-to-digital converter is set to at least a first digitization rate to generate the signal spectrum of the input signal.

26. The apparatus of claim 25 in which the variable frequency signal generator is further settable to at least a second frequency.

27. The apparatus of claim 26 in which the variable frequency signal generator is settable by the processor to at least the first and second frequencies.

28. The apparatus of claim 20 in which the processor includes a memory for storing the normal frequency-domain data record.

29. The apparatus of claim 20 in which the processor includes a memory for storing the shifted frequency-domain data record.

30. The apparatus of claim 20 in which the processor converts the first, second, and third amplitudes into values expressed in decibels.

* * * * *